(12) United States Patent  
Takeshita et al.

(10) Patent No.: US 8,222,155 B2  
(45) Date of Patent: *Jul. 17, 2012

(54) SELECTIVITY CONTROL IN A PLASMA PROCESSING SYSTEM

(75) Inventors: Kenji Takeshita, Fremont, CA (US); Odette Turmel, Fremont, CA (US); Felix Kozakevich, Sunnyvale, CA (US); Eric Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 1033 days.

This patent is subject to a terminal disclaimer.

(21) Appl. No.: 11/969,833

(22) Filed: Jan. 4, 2008

(65) Prior Publication Data

US 2008/0113516 A1 May 15, 2008

Related U.S. Application Data

(63) Continuation of application No. 10/881,410, filed on Jun. 29, 2004, now Pat. No. 7,517,801.

(51) Int. Cl.
*H01L 21/302* (2006.01)
(52) U.S. Cl. .. 438/706; 438/710; 438/714; 257/E21.483
(58) Field of Classification Search .................. 438/714, 438/706, 709–710
See application file for complete search history.

(56) References Cited

U.S. PATENT DOCUMENTS

| | | | |
|---|---|---|---|
| 5,656,123 A | 8/1997 | Salimian et al. | |
| 5,888,414 A | 3/1999 | Collins et al. | |
| 6,014,943 A | 1/2000 | Arami et al. | |
| 6,090,304 A | 7/2000 | Zhu et al. | |
| 6,841,483 B2 | 1/2005 | Zhu et al. | |
| 7,517,801 B1* | 4/2009 | Takeshita | 438/706 |
| 2002/0111036 A1 | 8/2002 | Zhu et al. | |
| 2002/0182881 A1 | 12/2002 | Ni et al. | |

(Continued)

FOREIGN PATENT DOCUMENTS

JP 8 321496 12/1996

(Continued)

OTHER PUBLICATIONS

"First Office Action", Issued in Japanese Application No. 2006-547307; Mailing Date: Sep. 27, 2010.

(Continued)

*Primary Examiner* — Thanh Nguyen
(74) *Attorney, Agent, or Firm* — IPSG, P.C., Intellectual Property Law

(57) ABSTRACT

A method in a plasma processing system for etching a feature through a given layer on a semiconductor substrate. The method includes placing the substrate in a plasma processing chamber of the plasma processing system. The method also includes flowing an etchant gas mixture into the plasma processing chamber, the etchant gas mixture being configured to etch the given layer. The method additionally includes striking a plasma from the etchant source gas. Furthermore, the method includes etching the feature at least partially through the given layer while applying a bias RF signal to the substrate, the bias RF signal having a bias RF frequency of between about 45 MHz and about 75 MHz. The bias RF signal further has a bias RF power component that is configured to cause the etch feature to be etched with an etch selectivity to a second layer of the substrate that is higher than a predefined selectivity threshold.

20 Claims, 18 Drawing Sheets

U.S. PATENT DOCUMENTS

| | | | |
|---|---|---|---|
| 2003/1006858 | | 4/2003 | Komada |
| 2004/0005789 | A1 | 1/2004 | Jiwari |
| 2004/0045673 | A1 | 3/2004 | Yasui |
| 2004/0209469 | A1 | 10/2004 | Harada |
| 2004/0219797 | A1 | 11/2004 | Honda et al. |
| 2005/0026430 | A1 | 2/2005 | Kim et al. |
| 2005/0101135 | A1 | 5/2005 | Annapragada et al. |
| 2006/0121729 | A1 | 6/2006 | Takeshita et al. |

FOREIGN PATENT DOCUMENTS

| | | |
|---|---|---|
| JP | 2001135630 A | 5/2001 |
| JP | 2003100718 A | 4/2003 |
| JP | 2003124189 A | 4/2003 |
| JP | 2003234331 A | 8/2003 |
| JP | 2003309111 A | 10/2003 |
| WO | WO-01-48789 | 7/2001 |
| WO | WO-03043072 A1 | 5/2003 |

OTHER PUBLICATIONS

"U.S. Appl. No. 10/881,410", filed Jun. 29, 2004.
Healey, Jerry "Current Technical Trends: Dual Damascene & Low-k Dielectrics", 2002, Threshold Systems, pp. 1-6.
Mahorowala, et al., "Transfer Etching of Bilayer Resists in Oxygen-Based Plasmas", J. Vac. Sci. Technol. A vol. 18, Issue 4, pp. 1411-1419 (Jul. 2000).
Cho, et al., "More Vertical Etch Profile Using a Faraday Cage in Plasma Etching", May 1999, American Institute of Physics, Review of Scientific Instruments, vol. 70, No. 5, pp. 2458-2461.
Nunan, Peter "The Challenge of Low k Issues and Considerations for Accelerated Performance", 2000, Yield Management Solutions, pp. 17-22.
Lassig, et al., "Selective Removal Strategies for Low k Dual Damascene", Semiconductor Fabtech, Dec. 1, 2002, pp. 185-190.
"Chapter 7: Plasma Basic", Power Point Presentation, no date, pp. 1-36.
Morey, et al., "Etch Challenges of Low-k Dielectrics", Jun. 1999, vol. 42, Issue 6, 7 pages total.
Fairchild, Christa et al., "Optimization of Ion and Electrical Properties in IC Packaging Applications", 2000, March instruments, 6 pages total.
"Non Final Office Action", U.S. Appl. No. 10/745,846, Mailing Date: Jul. 15, 2005.
"Final Office Action", U.S. Appl. No. 10/745,846, Mailing Date: Jun. 5, 2006.
"Non Final Office Action", U.S. Appl. No. 10/745,846, Mailing Date: Feb. 8, 2007.
"Final Office Action", U.S. Appl. No. 10/745,486, Mailing Date: Jun. 25, 2007.
"Non Final Office Action", U.S. Appl. No. 10/881,410, Mailing Date: Oct. 17, 2006.
"Written Opinion", PCT/US04/43115, Mailed: Aug. 1, 2006.
"International Search Report", PCT/US04/43115, Mailed: Aug. 1, 2006.
"International Report on Patentability", PCT/US04/43115, Report Issuance Date: Sep. 13, 2006.
"Final Office Action", U.S. Appl. No. 10/881,410, Mailing Date: Jun. 1, 2007.
"First Office Action", Application No. 200480040955.4, Mailing Date: Feb. 15, 2008.
"Decision of Refusal", Japanese Application No. 2006-547307, Mailing Date: Feb. 17, 2011.
"Preliminary Office Action", Korean Application No. 2006-7012761, Mailing Date: May 4, 2011.
"Office Action", Taiwan Patent Application No. 093140319, Mailing Date: Sep. 1, 2011.
"Taiwan Search Report", Taiwan Patent Application No. 093140319, Mailing Date: Sep. 1, 2011.
"Examination Report", European Patent Application Number: 04-815-227.6-1235, Mailing Date: Nov. 2, 2011.
Schaepkens, et al., "Effects of Radio Frequency Bias Frequency and Radio Frequency Bias Pulsing on SiO2 Feature Etching in Inductively Coupled Fluorocarbon Plasmas", Journal of Vacuum Science & technology B: Microelectronics Processing and Phenomena, American Vacuum Society, New York, NY, vol. 18, No. 2, Mar. 1, 2000, pp. 856-863, Xp012008130, ISSN: 0734-211X.
Schaepkens, et al., "Effect of Radio Frequency Bias Power on SiO2 Feature Etching in Inductively Coupled Fluorocarbon Plasmas", Journal of Vacuum Science & Technology B: Microelectronics Processing & Phenomena, American Vacuum Society, New York, NY, vol. 18, No. 2, Mar. 1, 2000, pp. 848-855, XP012008129, ISSN: 0734-211X.

* cited by examiner

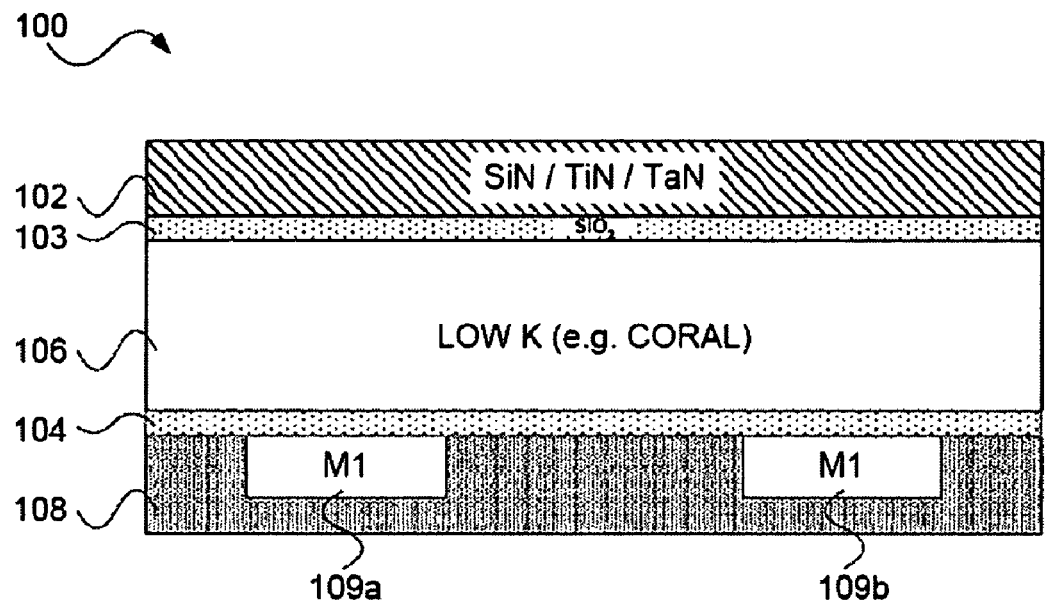
FIG. 1A (Prior Art)
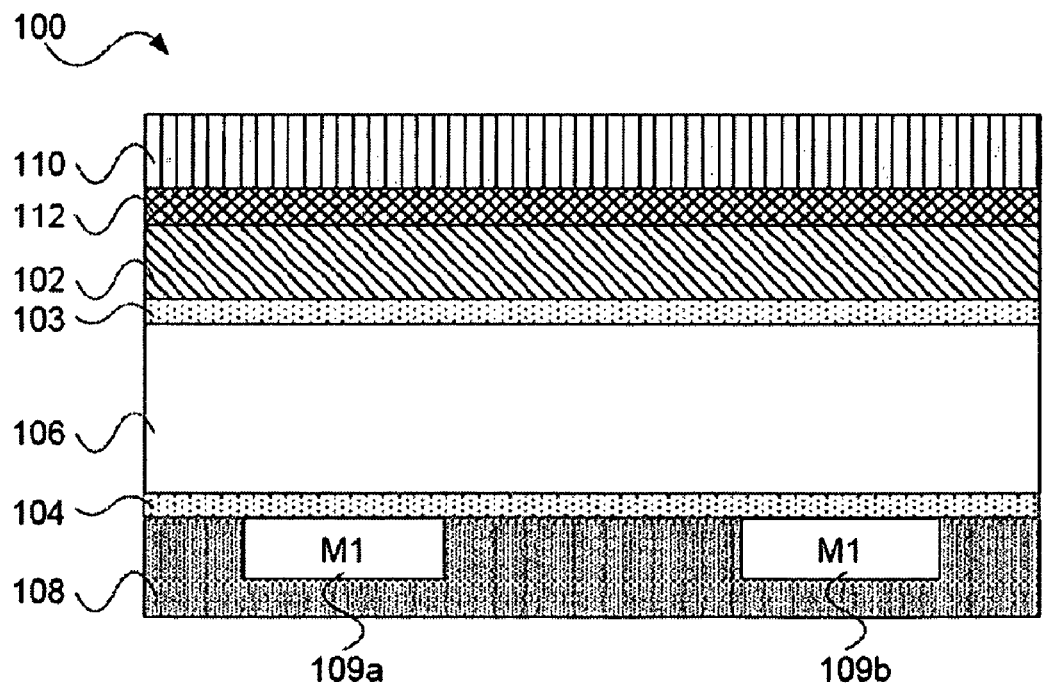
FIG. 1B (Prior Art)

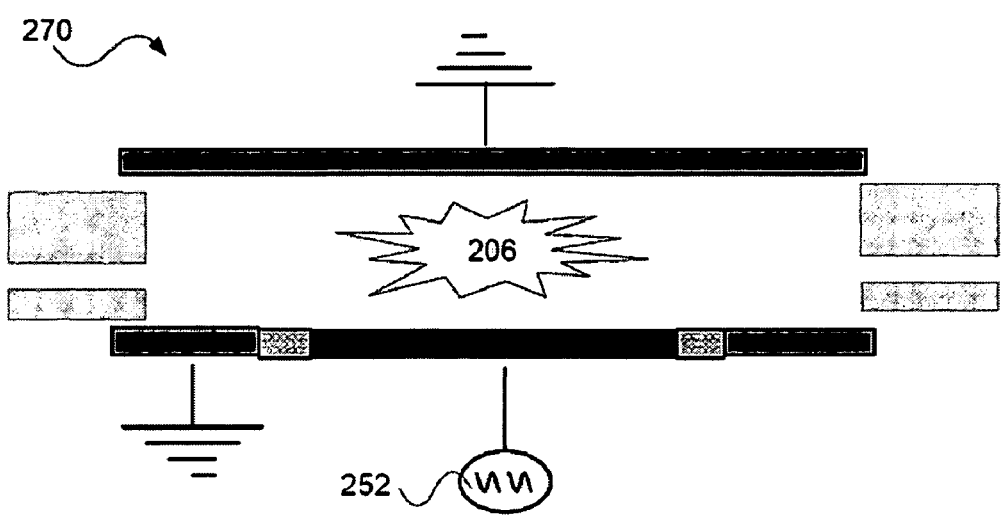
FIG. 2C (Prior Art)

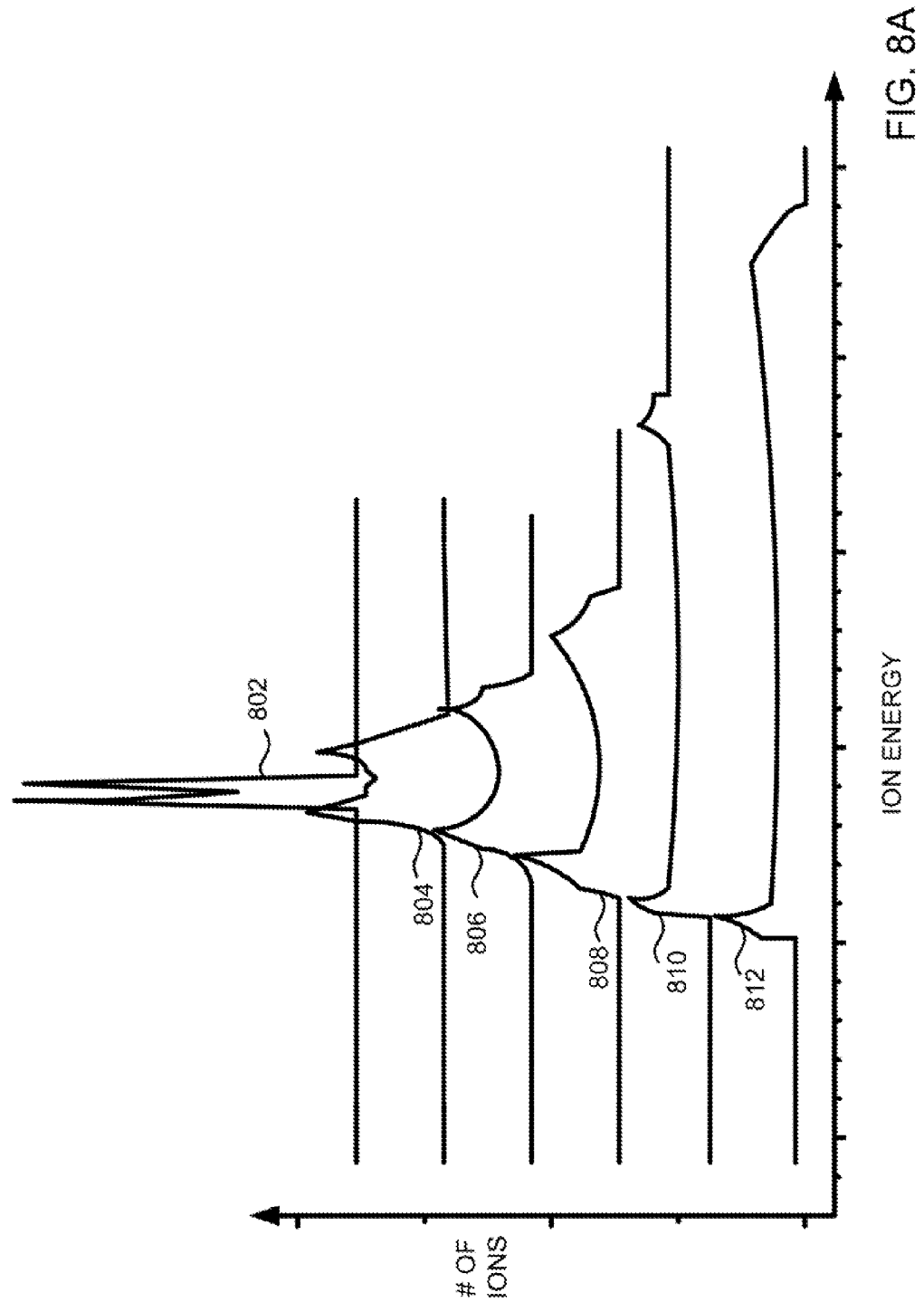

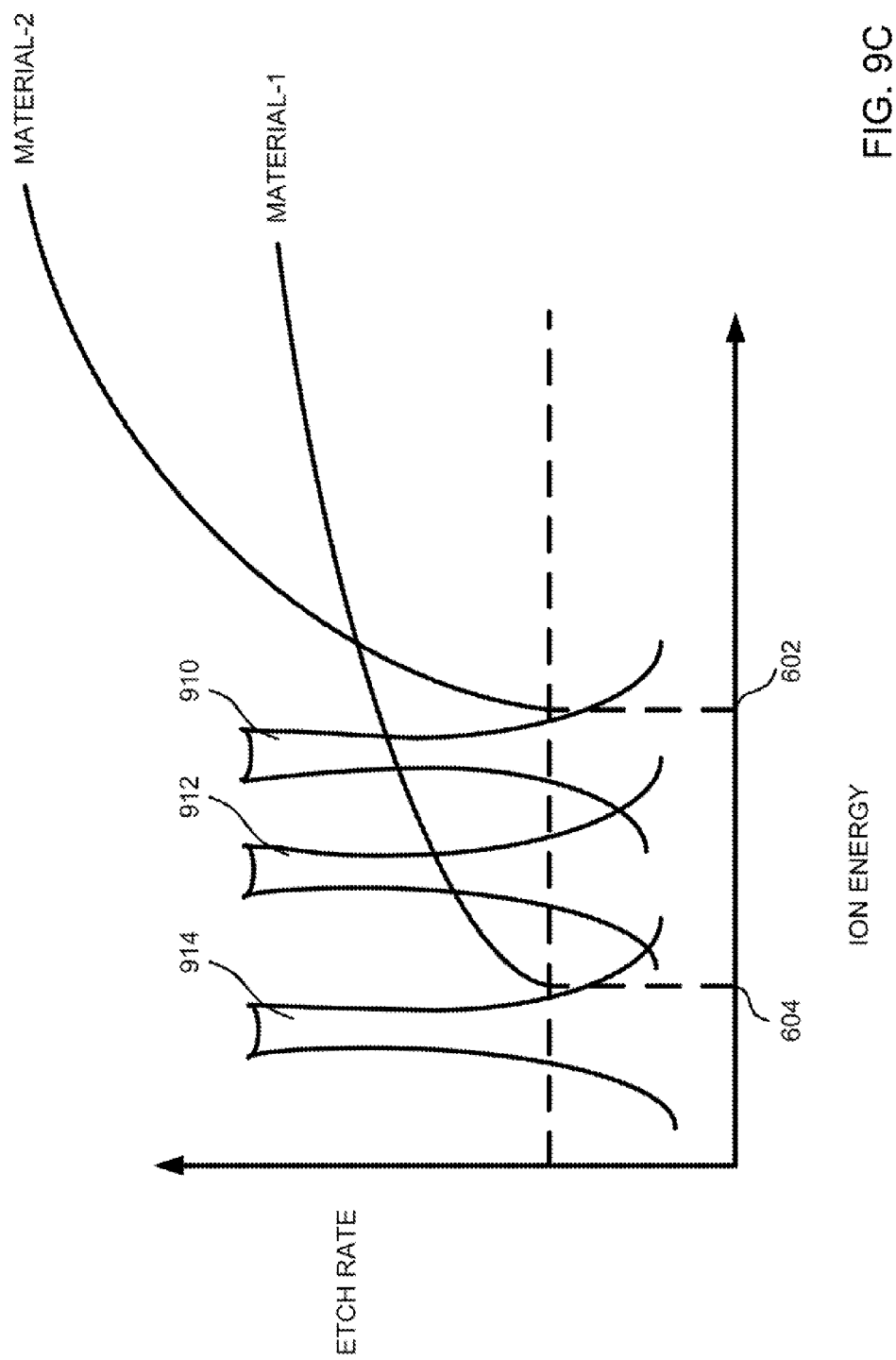

SELECTIVITY CONTROL IN A PLASMA PROCESSING SYSTEM

This application is a continuation application under 37 CFR 1.53(b) of and claims the benefit under 35 U.S.C. 120 of a commonly-owned patent application entitled "SELECTIVITY CONTROL IN A PLASMA PROCESSING SYSTEM" filed Jun. 29, 2004, by inventors Kenji Takeshita, application Ser. No. 10/881,410, now U.S. Pat. No. 7,517,801 which is incorporated herein by reference.

BACKGROUND OF THE INVENTION

The present invention relates in general to substrate manufacturing technologies and in particular to methods and apparatus for the optimization of ion energy control in a plasma processing system.

In the processing of a substrate, e.g., a semiconductor wafer or a glass panel such as one used in flat panel display manufacturing, plasma is often employed. As part of the processing of a substrate (chemical vapor deposition, plasma enhanced chemical vapor deposition, physical vapor deposition, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

Integrated circuits are sequentially created by forming conductive patterns on dielectric layers on a substrate. In an exemplary plasma process, a substrate is coated with a thin film of hardened emulsion (i.e., such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck. Appropriate etchant source gases (e.g., $C_4F_8$, $C_4F_6$, $CHF_3$, $CH_2F_3$, $CF_4$, $CH_3F$, $C_2F_4$, $N_2$, $O_2$, Ar, Xe, He, $H_2$, $NH_3$, $SF_6$, $BCl_3$, $Cl_2$, etc.) are then flowed into the chamber and struck by a set of RF frequencies to form a plasma to etch exposed areas of the substrate. By controlling the amount of ion energy in the plasma through adjustments in a set of RF frequencies, the etch process is optimized.

In a common substrate manufacturing method, known as dual damascene, dielectric layers are electrically connected by a conductive plug filling a via hole. Generally, an opening is formed in a dielectric layer, which is then filled with a conductive material (e.g., aluminum (Al), copper (Cu), etc.) that allows electrical contact between two sets of conductive patterns. This establishes electrical contact between two active regions on the substrate, such as a source/drain region. Excess conductive material on the surface of the dielectric layer is typically removed by chemical mechanical polishing (CMP).

There are generally two approaches manufacture dual damascene substrates: Via-First and Trench-First. In one example of the Via-First methodology, the substrate is first coated with photoresist and then the vias are lithographically patterned. Next, an anisotropic etch cuts through the surface cap material and etches dozen through the low K layer of the substrate, and stops on a silicon nitride barrier, just above the underlying metal layer. Next, the via photoresist layer is stripped, and the trench photoresist is applied and lithographically patterned. Some of the photoresist will remain in the bottom of the via and prevent the lower portion via from being over-etched during the trench etch process. A second anisotropic etch then cuts through the surface cap material and etches the low K material down to a desired depth. This etch forms the trench. The photoresist is then stripped and the Silicon Nitride barrier at the bottom of the via is opened with a ver soft, low-energy etch that will not cause the underlying copper to sputter into the via. As described above, the trench and via are filled with a conductive material (e.g., aluminum (Al), Copper (Cu), etc.) and polished by chemical mechanical polishing (CMP). And although the via-first approach has been widely adopted for small geometry devices because it avoids the photoresist pooling effect that occurs when the trenches are formed before the vias, it is also prone to photoresist poisoning.

An alternate methodology is trench-first. In one example, the substrate is coated with photoresist and a trench lithographic pattern is applied. An anisotropic dry etch then cuts through the surface hard mask (again typically SiN, TiN or TaN) followed by stripping the photoresist. Another photoresist is applied over the trench hard mask and then the vias are lithographically patterned. A second anisotropic etch then cuts through cap layer and partially etches down into the low K material. This etch forms the partial vias. The photoresist is then stripped for trench etch over the vias with the hard mask. The trench etch then cuts through the cap layer and partially etches the low K material down to desired depth. This etch also clears via holes at the same time stopping on the final barrier located at the bottom of the via. The bottom barrier is then opened with a special etch. And unlike the via-first methodology, photoresist poisoning may be substantially less.

However, escalating requirements for high circuit density on substrates may be difficult to satisfy using current plasma processing technologies where sub-micron via contacts and trenches have high aspect ratios. The utilization of new low-k films and complex film stacks present a new set of challenges for dielectric etch processes and equipment.

To facilitate discussion, FIG. 1A illustrates an idealized cross-sectional view of a layer stack 100, representing the layers of an exemplar semiconductor 1C, prior to a lithographic step. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers.

At the bottom of layer stack 100, there is shown a layer 108, comprising $SiO_2$. Above layer 108 is disposed a barrier layer 104, typically comprising nitride or carbide (SiN or SiC). Dual damascene substrates further comprise a set of metal layers including M1 109a-b, typically comprising aluminum or copper. Above the barrier layer 104, is disposed a intermediate dielectric (IMD) layer 106, comprising a low K material (e.g., SiOC, etc.). Above the IMD layer 106, there may be placed a cap layer 103, typically comprising $SiO_2$. Above cap layer 103, there may be disposed a trench mask layer 102, typically comprising TiN, SiN, or TaN.

FIG. 1B shows a somewhat idealized cross-sectional view of layer stack 100 of FIG. 1A, after photoresist layer 110 and a BARC layer 112 is further added. FIG. 1C shows a somewhat idealized cross-sectional view of layer stack 100 of FIG. 1B after photoresist layer 110 and BARC layer 112 have been processed through lithography. In this example, a photoresist mask pattern is created with a set of trenches 114a-b.

FIG. 1D shows the cross-sectional view of layer stack 100 of FIG. 1C after trench mask layer 101 has been processed in the plasma system, further extending trench 114a-b to cap layer 103. FIG. 1E shows the cross-sectional view of layer stack 100 of FIG. 1D, after photoresist layer 110 and a BARC layer 112 are removed.

FIG. 1F shows the cross-sectional view of layer stack 100 of FIG. 1E after a second photoresist layer 116 and a BARC layer 118 are disposed, in order to create a second metal layer and a via connecting it to the first metal layer 109a-b. FIG. 1G shows the cross-sectional view of layer stack 100 of FIG. 1F after the photoresist layer has been opened and an etch has been performed to partially etch into IMD layer 106 to create a via FIG. 1H shows the cross-sectional view of layer stack 100 of FIG. 1G after photoresist layer 110 and BARC layer 112 have been stripped, and an additional etch process has been performed to extend the trench to a desired depth and etch through a via stopping on barrier layer 104. In FIG. 1I, the barrier layer 104 is etched through using, for example $CH_2F_2$, $CH_3F$, etc. In FIG. 1J, a chemical mechanical polish process has been performed to polish layer stack 100 down to cap layer 103, and a conductive material (e.g., aluminum (Al), Copper (Cu), etc.) has been deposited to contact the existing M1 metal material.

In a typical plasma processing system, a first RF energy source may be employed to create a cloud of ions for the processing a substrate. Generally speaking, this first RF energy source may be said to be generating a source RF signal for dissociating the ions. In addition, there is another RF energy source for creating a bias with the plasma, and directing the plasma away from structures within the plasma processing system and toward the substrate. Generally speaking, this second RF energy source may be said to be generating a bias RF signal for controlling the ion energy.

For example, a dual frequency triode configuration may have a source RF generator at the top of the chamber, and a bias RF generator coupled to provide the bias RF signal to the substrate. Referring now to FIG. 2A, a simplified diagram of a dual frequency triode plasma processing system 200 is shown. A typical arrangement is to employ a substantially high frequency source RF generator 202 (e.g., 27 MHz, 60 MHz, or 100 MHz) to provide a corresponding source RF signal an upper electrode, and a substantially lower frequency bias RF generator 204 (e.g., 8 KHz, 2 MHz, or 3 MHz) to provide a corresponding bias RF signal to the lower electrode, which is coupled to a substrate.

A dual frequency diode configuration may have both the source and bias RF generators coupled to provide both source and bias RF signals to the substrate. Referring now to FIG. 2B, a simplified diagram of a dual frequency diode plasma processing system 250 is shown. A plasma 206 forms above the substrate, and is accelerated down into the substrate to physically bombard and etch silicon or other materials from the substrate by an electric field formed between the plasma and the negatively charged wafer. A typical arrangement is to provide both a substantially high frequency source RF generator 252 (e.g., 27 MHz, 60 MHz, or 100 MHz) and a substantially lower frequency bias RF generator 254 (e.g., 8 KHz, 2 MHz, or 3 MHz) to provide both the source RF signal and the bias RF signal to the lower electrode, which is coupled to a substrate.

Single frequency diode configuration may have a single bias RF sources coupled to provide the bias RF signal to the substrate. Referring now to FIG. 2C, a simplified diagram of a single frequency diode plasma processing system 270 is shown. A plasma 206 forms above the substrate, and is accelerated down into the substrate to physically bombard and etch silicon or other materials from the substrate by an electric field formed between the plasma and the negatively charged wafer. A typical arrangement is to provide a single frequency bias RF generator 252 (e.g., 13.56 MHz,) to provide a bias RF signal to the lower electrode, which is coupled to a substrate.

While not wishing to be bound by theory, fast moving electrons in the plasma generally tend to be absorbed by walls or other boundaries. In order to maintain a charge balance in the plasma, a thin positive ion sheath may be formed near each wall or boundary such as those proximate the substrate. This creates an electric field which tends to accelerate ions in the plasma into the wall or boundary, with a substantial amount of energy. If the plasma is not properly optimized, faceting or corner sputtering (or erosion) occurs on the substrate surface. A facet is the result of a non-linear profile in the substrate, such as in a trench sidewall. A corner sputtering is a result of an undesirable removal of additional material, particularly of the material at the upper corners of the feature to be etched.

Accurate control of faceting and unwanted corner sputtering becomes critical in dual damascene etches, particularly in copper dual damascene etches in which no plugs or multiple hard masks are employed (e.g., in a trench-first dual damascene dielectric etch). Up to now, no attempts have been made to employ RF configuration, particularly RF configuration of the bias RF generator, to minimize faceting and unwanted corner sputtering, maximizing the process window, and obtaining the desired vertical etch profile.

SUMMARY OF THE INVENTION

The invention relates, in one embodiment, to a method in a plasma processing system for etching a feature at least partially through a given layer on a semiconductor substrate. The method includes placing the substrate in a plasma processing chamber of the plasma processing system. The method also includes flowing an etchant gas mixture into the plasma processing chamber, the etchant gas mixture being configured to etch the given layer. The method additionally includes striking a plasma from the etchant source gas. Furthermore, the method includes etching the feature at least partially through the given layer while applying a bias RF signal to the substrate, the bias RF signal having a bias RF frequency of between about 45 MHz and about 75 MHz. The bias RF signal further has a bias RF power component that is configured to cause the etch feature to be etched with an etch selectivity to a second layer of the substrate that is higher than a predefined selectivity threshold.

In another embodiment, the invention relates to a method in a plasma processing system for determining a recipe for etching a feature at least partially through a given layer a semiconductor substrate. The method includes a step a) placing the substrate in a plasma processing chamber of the plasma processing system. The method also includes a step b) flowing an etchant gas mixture into the plasma processing chamber, the etchant gas mixture being configured to etch the given layer. The method additionally includes a step c) striking a plasma from the etchant source gas to etch the given layer and a step d) ascertaining, after the plasma is extinguished, an etch selectivity level relative to a second layer for a combination of a bias RF frequency and a RF power level of a bias RF signal applied to the substrate while the plasma is present. In step e), if the etch selectivity level does not exceed a predefined selectivity threshold, the method includes varying at least one of the bias RF frequency while keeping the bias frequency with a range between about 45 MHz and about 75 MHz and the RF power level and repeating steps a) through e) until the etch selectivity level exceeds the predefined selectivity threshold. In step f), if the etch selectivity level exceeds the predefined selectivity threshold, the method includes employing the bias RF frequency and the RF power level utilized during an etch that yields the selectivity level in the recipe.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1A-J illustrate a cross-sectional view of an exemplary layer stack 100 undergoing the dual damascene process;

FIG. 2C illustrates a simplified diagram of a single frequency triode plasma processing system;

FIG. 8A shows the response of the 2 MHz RF signal at various bias RF powers.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that in a plasma processing system, that faceting and/or corner sputtering (generically, etch profile) is strongly influenced by ion energy. Ion energy, in turn, is strongly influenced by the RF configuration of the bias RF signal, particularly to the frequency component of the bias RF signal. The ion energy is also influenced by the power component of the bias RF signal. The invention thus addresses the use of bias RF signal configuration in plasma processing systems in order to minimize faceting and/or corner sputtering and/or improves the vertical etch profile in dielectric etches, particularly in dielectric etched through low-K layers.

It is believed that plasma is generally comprised of weakly ionized plasma. Because the plasma discharge is RF driven and weakly ionized, electrons in the plasma are not in thermal equilibrium with ions. That is, while the heavier ions efficiently exchange energy by collisions with the background gas (e.g., argon, etc.), electrons absorb the thermal energy. Because electrons have substantially less mass than that of ions, electron thermal velocity is much greater than the ion thermal velocity. This tends to cause the faster moving electrons to be lost to surfaces within the plasma processing system, subsequently creating positively charged ion sheath between the plasma and the surface.

Ions that enter the sheath are then accelerated into the surface. Lower bias RF frequencies tend to cause plasma ions to cross the sheath in less than one RF cycle. Generally speaking, lower bias RF frequencies tend to result in higher ion energy, which leads to faceting and/or corner sputtering if the RF bias signal not optimized. Likewise, higher bias RF frequencies tend to cause plasma ions take several RF cycles to cross the sheath. Generally speaking, the higher bias RF frequencies tend to result in lower ion energy, which results in inadequate etching or non-anisotropic etching if the RF bias signal is not optimized.

It is believed that if the ion energy is not properly optimized, the etch is slowed down to the point where the etch rate becomes unduly slow for efficient production. Alternatively and/or additionally, faceting and/or corner sputtering occurs.

Figure 3:
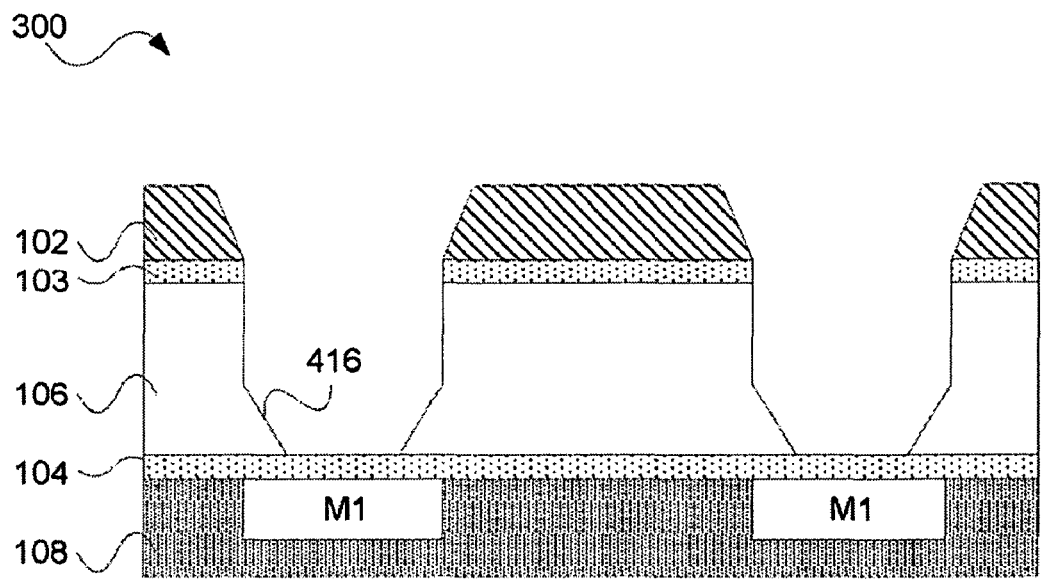
FIG. 3 illustrates a layer stack in which the etch profile is faceted due to inadequately optimized plasma.

FIG. 3 shows the situation wherein the ion energy is not optimized during the IMD trench etch that is employed to create a second metal layer and etch through a via hole to contact barrier layer 104, resulting in cornering sputtering/faceting. In comparison to etch profile 118 in FIG. 1H, etch profile 416 has been substantially corrupted due excessive ion energy (e.g., by, using a bias RF signal with an unduly low frequency), causing severe faceting and/or corner sputtering. This corner sputtering can be clearly seen by the excessive material removed from the corner regions in mask layer 102 and IMD layer 106.

Figure 4:
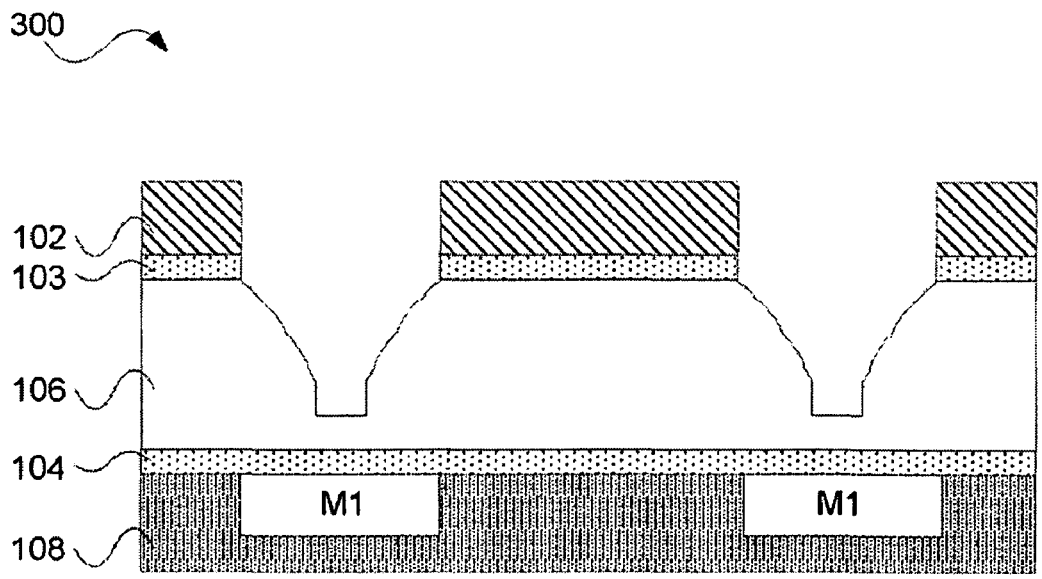
FIG. 4 illustrates a layer stack in which the etch is incomplete due to inadequately optimized plasma.

FIG. 4 shows the situation wherein the ion energy is not optimized during the IMD trench etch that is employed to create a second metal layer and etch through a via hole to contact barrier layer 104, resulting in a taper trench profile and an incomplete via etch.

Figure 5:
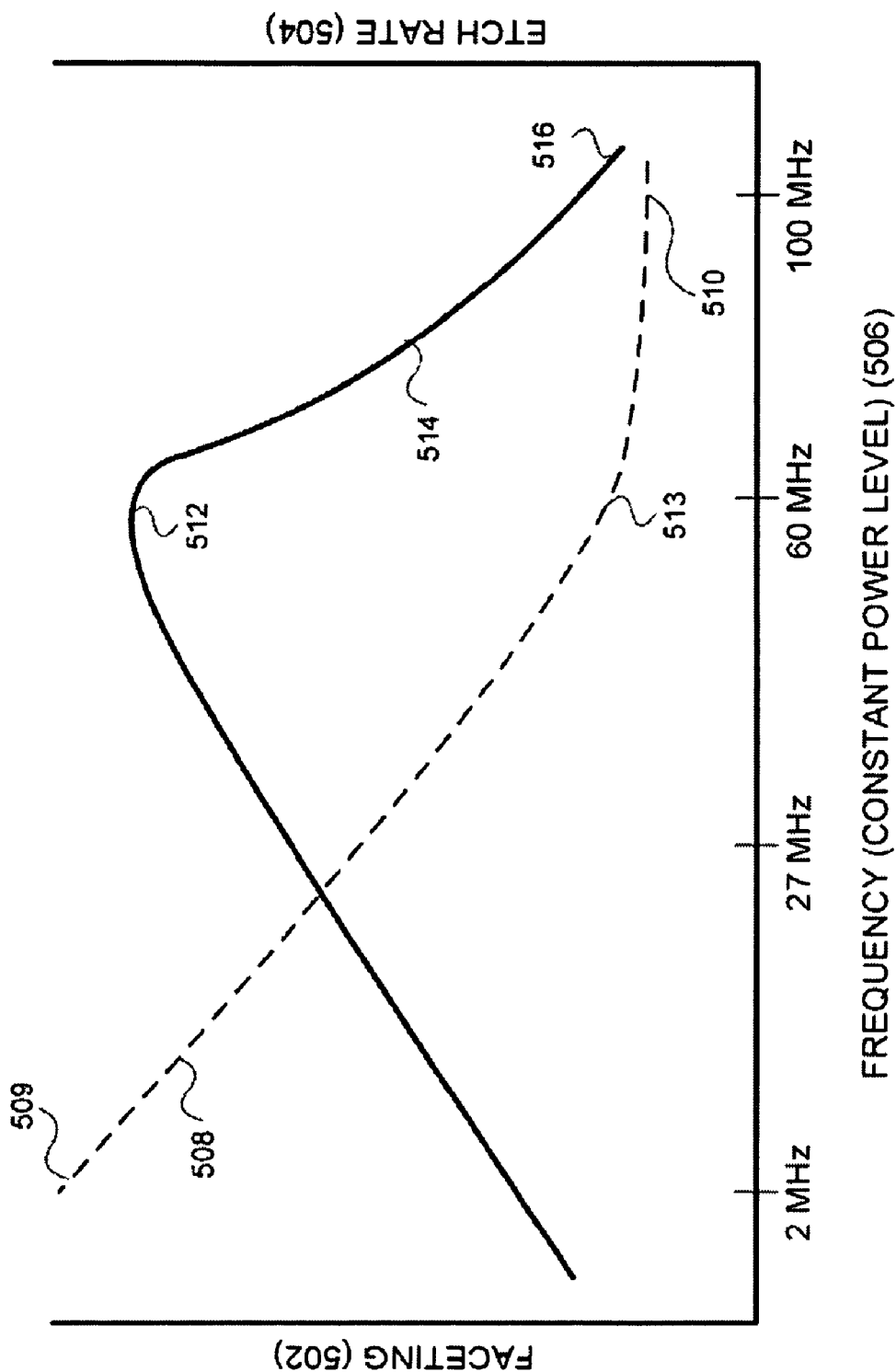
FIG. 5 illustrates a simplified diagram comparing faceting and etch rate to RF frequency at a given power level, according to one embodiment of the invention.

Referring now to FIG. 5, a simplified diagram comparing faceting (represented by the dashed line and measured against axis 502), etch rate through the low-K layer (represented by the solid line and measured against axis 504) as a function of the bias RF frequency (shown on axis 506) at a given power level. Faceting may be measured using conventional faceting measurement methodology. FIG. 5 intends to illustrate that as the bias RF frequency is increased, the etch rate increases and the amount of faceting/corner sputtering decreases (e.g., from about 2 MHz to about 60 MHz in our example). In particular, the increase in etch rate is rapid to about 30 MHz, and then increases less rapidly to about 60 MHz where the etch rate essentially flattens out until about 70 MHz. After about 70 MHz, the etch rate begins to slow down dramatically (e.g., from about 70 MHz to about 100 MHz), signifying that the ion energy level is now below what is necessary for an efficient etch.

At the bias RF frequency of 60 MHz 512, it is observed by the inventors that the etch rate is at its maximum while the faceting is near its minimum. However, an advantageous process window exists when the bias RF signal is between about 30 MHz and about 80 MHz, and even an even more advantageous process window exists when the bias RF signal is between about 45 MHz and abut 75 MHz where the etch rate is high and the faceting/corner sputtering is low.

Generally speaking, increasing the bias RF power at a given bias RF frequency setting will cause an increase in both the etch rate and the amount of faceting/corner sputtering. Too much bias RF power will cause an excessive amount of faceting/corner sputtering while too little bias RF power will unduly decrease the etch rate. Thus, power setting is another knob for controlling the process to stay within the desired etch rate vs. faceting/corner sputtering parameters.

In accordance with one embodiment of the invention, in order to optimize the plasma etch rate while also minimizing faceting in a plasma processing system, a bias RF signal of between about 27 MHz and about 90 MHz in frequency may be employed for a dual damascene trench etch through the low-K dielectric layer. Bias frequency is important as it controls the ion energy distribution. At a higher bias frequency, the ion energy distribution is narrow and contributes to the reduction of the corner sputtering/faceting problem. The bias RF signal is preferably selected with an optimal combination of bias RF frequency/bias RF power such that the ion energy is optimized and minimal and/or commercially acceptable faceting and corner sputtering is achieved while maintaining a commercially acceptable vertical profile. As the term is employed herein, commercially acceptability denotes that the result falls within specification for satisfactory operation of the final semiconductor product under fabrication. The optimal bias frequency/bias power combination may be empirically determined for a test substrate and the optimal parameters found may be employed during production. Of course the optimal bias frequency/bias power combination varies depending on the chemistry employed and the composition of the layer being etched.

For example, at about 27 MHz of bias frequency, the RF power setting may be between about 100 W and about 1500 W, more preferably between about 200 W and 1,200 W, and preferably at about 400 W. For example, at about 90 MHz of bias frequency, the RF power setting may be between about 200 W and about 2,000 W, more preferably between about 400 W and 1,500 W, and preferably at about 1,000 W.

In accordance with another embodiment of the invention, in order to optimize the plasma etch rate while also minimizing faceting in a dual frequency triode plasma processing system, a bias RF signal of between about 30 MHz and about 80 MHz in frequency may be employed. The bias RF signal is preferably selected with an optimal combination of bias RF frequency/bias RF power such that the ion energy is controlled and minimal and/or commercially acceptable faceting and corner sputtering is achieved while maintaining a commercially acceptable vertical profile. For example, at about 30 MHz of bias frequency, the RF power setting may be between about 100 W and about 1500 W, more preferably between about 200 W and 1,200 W, and preferably at about 400 W. For example, at about 80 MHz of bias frequency, the RF power setting may be between about 200 W and about 1,800 W, more preferably between about 400 W and 1,200 W, and preferably at about 800 W.

In accordance with another embodiment of the invention, in order to optimize the plasma etch rate while also minimizing faceting in a dual frequency triode plasma processing system, a bias RF signal of between about 45 MHz and about 75 MHz in frequency may be employed. The bias RF signal is preferably selected with an optimal combination of bias RF frequency/bias RF power such that the ion energy is controlled and minimal and/or commercially acceptable faceting and corner sputtering is achieved while maintaining a commercially acceptable vertical profile. For example, at about 45 MHz of bias frequency, the RF power setting may be between about 100 W and about 15000 W, more preferably between about 200 W and 1200 W, and preferably at about 400 W. For example, at about 75 MHz of bias frequency, the RF power setting may be between about 200 W and about 1,800 W, more preferably between about 400 W and 1,200 W, and preferably at about 800 W.

In accordance with another embodiment of the invention, in order to optimize the plasma etch rate while also minimizing faceting in a dual frequency triode plasma processing system, a bias RF signal of about 60 MHz is found to be particularly suitable. The bias RF signal is preferably selected with an optimal combination of bias RF frequency/bias RF power such that the ion energy is controlled and minimal and/or commercially acceptable faceting and corner sputtering is achieved while maintaining a commercially acceptable vertical profile. For example, at about 60 MHz of bias frequency, the RF power setting may be between about 200 W and about 1,500 W, more preferably between about 400 W and 1,000 W, and preferably at about 600 W.

In conjunction with the guidelines discussed above, a graph similar to FIG. 5 also furnishes a way for a process engineer to tune a particular dielectric etch process to a particular plasma processing chamber configuration. If a set of data for etch rate vs. faceting/corner sputtering is empirically obtained for a range of bias RF frequencies of interest and/or a range of RF power settings of interest, the process engineer can more accurately obtain the desired process window with the bias RF frequency knob and the bias RF power knob for a particular dielectric etch process and/or a particular plasma processing system while still achieving the desired parameters (i.e., at particular values or within an acceptable range of values) with respect to the etch rate and faceting/corner sputtering (generically, etch profile).

With respect to the discussion above, it is noted that the plasma processing chamber may be of a dual frequency design, i.e., one having a separate source RF signal and a separate bias RF signal. The source RF signal and the bias RF signal may be provided in a dual-frequency diode configuration (wherein both the source RF signal and the bias RF signal are applied to the substrate such as in an Excelan™ series machine by Lam Research Corporation of Fremont, Calif.), a dual-frequency triode configuration (wherein only the RF bias signal is applied to the substrate).

Additionally, the plasma processing chamber may be of a single frequency design, i.e., only RF bias signal with no separate source RF signal. Since the bias RF signal controls the ion energy, proper control of the bias RF signal results in the desired minimization of faceting and corner sputtering while maintaining a commercially acceptable vertical profile. It has been found that with a single-frequency design, a bias RF frequency signal of between about 45 MHz and about 75 MHz is particularly useful for minimizing faceting and/or corner sputtering while maintaining the aforementioned commercially acceptable vertical etch profile. In particular, it has been found that the single frequency design, when operated at a bias RF signal of about 60 MHz is particularly well-suited to for minimizing faceting and/or corner sputtering while maintaining the aforementioned commercially acceptable vertical etch profile for a dual-damascene trench etch.

Furthermore, it is not necessary that the plasma processing chamber be of a capacitively coupled plasma design. For example, the top RF source may be an inductive coil (such as those in TCP™ plasma etchers available from Lam Research Corporation of Fremont, Calif.), and the bias RF signal may still be provided to the substrate and controlled during etching. Likewise, the top RF source may be an ECR (Electron Cyclotron Resonance) source, and the bias RF signal may still be provided to the substrate and controlled during etching. In fact, it is contemplated that the source RF signal may be furnished using any RF signal generation arrangement since the invention deals with controlling the bias RF frequency and/or bias RF power to achieve the desired etch rate and low faceting/corner sputtering parameters.

Advantages of the invention include the optimization of RF configurations in a plasma processing system, in which an optimum set of frequencies and an optimum set of power settings are employed to substantially control faceting. Additional advantages include optimizing RF configurations in dual damascene plasma processing applications in order to substantially control faceting.

The inventor herein further realized that etch selectivity can be more finely tuned by selecting the appropriate combination of RF frequency and RF bias power. More particularly, by selecting the RF frequency having a narrow ion energy distribution, it is possible to dial the bias RF power to selectively etch one layer at a much higher rate than another layer.

This aspect may be better understood with reference to the table and figures that follow. As is known different materials have different respective chemical bonding energy among its constituent atoms and molecules. Table 1 below shows the chemical bonding energy values for some exemplary materials.

TABLE 1

| Material | D° 298/KJmol$^{-1}$ | Electron-Volt (eV) |
|---|---|---|
| Si—Si | 325 | 3.26 |
| O—Si | 799 | 8.28 |
| F—Si | 553 | 5.73 |
| Cl—Si | 406 | 4.21 |
| C—Si | 451 | 4.67 |
| N—Si | 470 | 4.87 |

As can be seen, oxides (Si—O) has a stronger chemical bond (8.28 electron-volt) than the chemical bond of Si—C (4.67 electron-volt). In turn, silicon carbide (Si—C) has a stronger chemical bond than silicon (Si—Si at 3.26 electron-volt).

Figure 6:
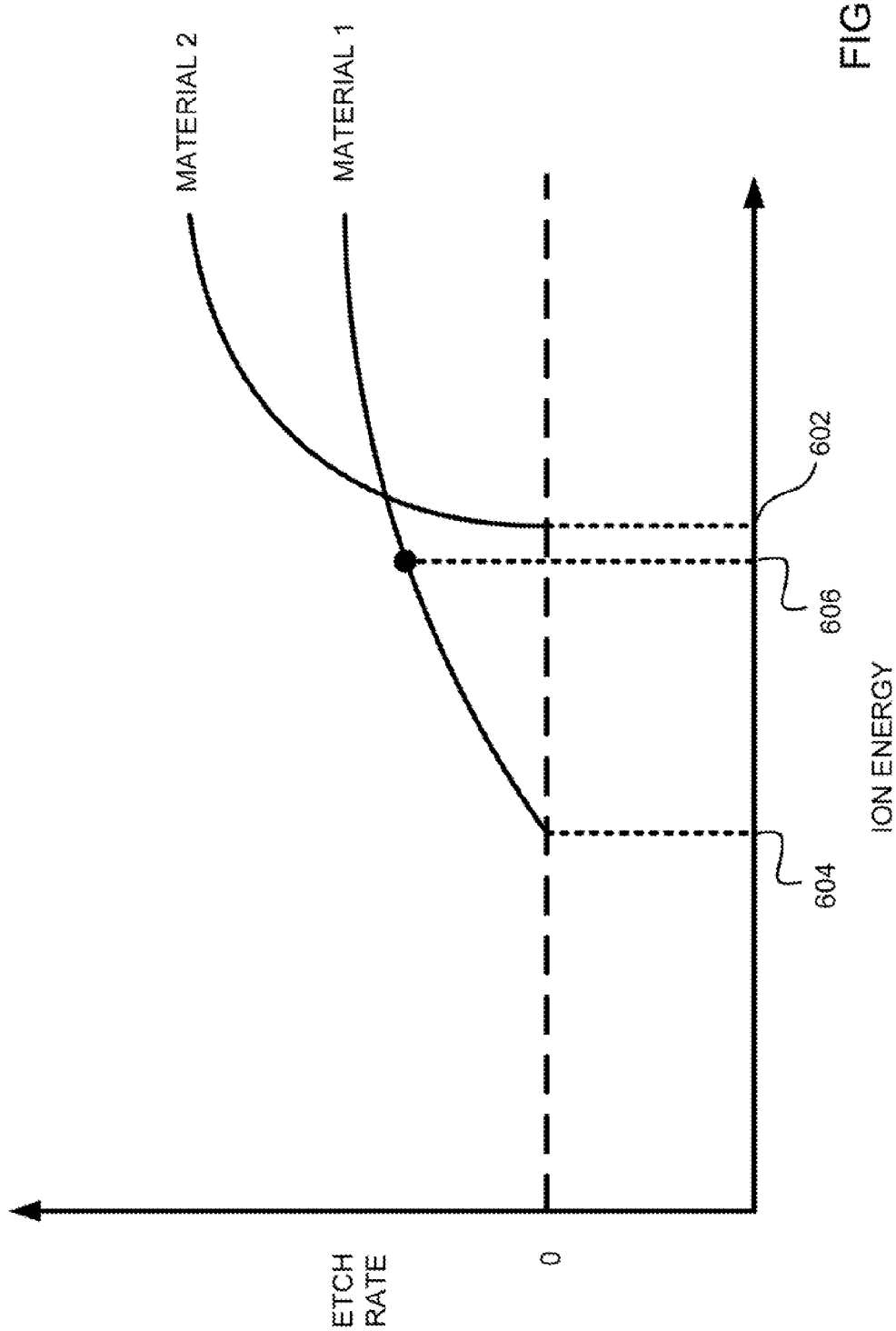
FIG. 6 shows the etch threshold for a hypothetical MATERIAL_1 and MATERIAL_2 respectively.

Correspondingly, the ion energy thresholds required to etch these materials differ. FIG. 6 shows the etch threshold for a hypothetical MATERIAL_1 and MATERIAL_2 respectively. Note that the ion energy threshold 602 for MATERIAL_2 is substantially higher than the ion energy threshold 604 for MATERIAL 1. If ion energy can be tailored such that most of the ion energy is focused in the region between 604 and 602, with little or any in the region to the right of point 602, a highly selective etch for MATERIAL_1 can be achieved.

The research performed by a the inventor suggests that as the RF frequency, decreases, two phenomena are observed: 1) the ion energy distribution tends to be wider, and 2) the sensitivity to RF power setting tends to increase. Conversely, as the RF frequency increases, the ion energy distribution tends to be narrower, and the sensitivity to RF power setting tends to decrease.

Figure 7:
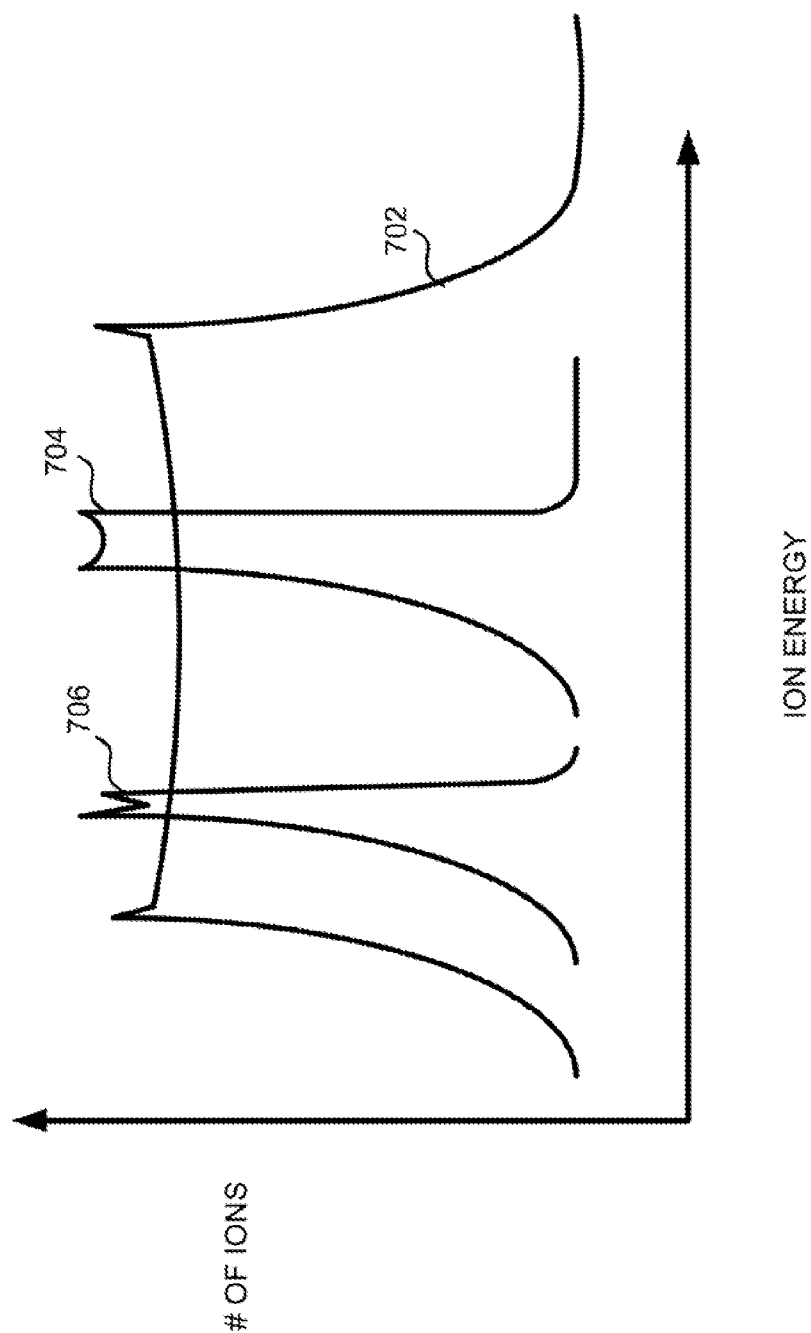
FIG. 7 shows some exemplary ion energy distribution for the 2 MHz, 60 MHz, and 100 MHz RF signals.

FIG. 7 shows some exemplary ion energy distribution for the 2 MHz, 60 MHz, and 100 MHz RF signals. As can be seen, the ion energy distribution for the 2 MHz RF signal (702) is substantially wider than that associated with either the 60 MHz RF signal (704) or that associated with the 100 MHz RF signal (706). The 100 MHz RF signal has a marginally narrower ion energy distribution than the 60 MHz RF signal.

From FIG. 7, one would expect that the higher the frequency of the RF signal, the narrower the ion energy distribution and therefore, an etch can be made more selective by selecting the highest RF frequency available. The expectation is that if most of the ion energy can be narrowly focused at the region immediately to the left of the etch threshold of MATERIAL_2 (such as the location shown by reference number 606), the result would be the highest etch rate for SiC and little if any etching of SiO2, i.e., a highly selective and advantageous etc.

It is discovered by the inventor, however, that beyond a certain RF frequency range, the response becomes saturated. To illustrate this phenomenon, consider the simplified (and not to scale to facilitate discussion) drawings below. FIG. 8A shows the response of the 60 MHz RF signal at 800 W bias RF power (802) as the base signal. There is shown the responses for an addition to the base signal of 25 W bias of 2 MHz RF power (804), an addition to the base signal 50 W bias of 2 MHz RF power (806), an addition to the base signal 100 W bias of 2 MHz RF power (808), an addition to the base signal 200 W bias of 2 MHz RF power (810), and an addition to the base signal 400 W bias of 2 MHz RF power (812), respectively. The base signal of 60 MHz at 800 W bias power is provided to help generate the plasma. Note that the width of the ion energy distribution (WIDTH) tends to get wider and the mean value shifts to the right so the ion energy tends to be higher at 400 W of bias RF power (compared to, for example, 50 W of bias RF power.

Figure 8B:
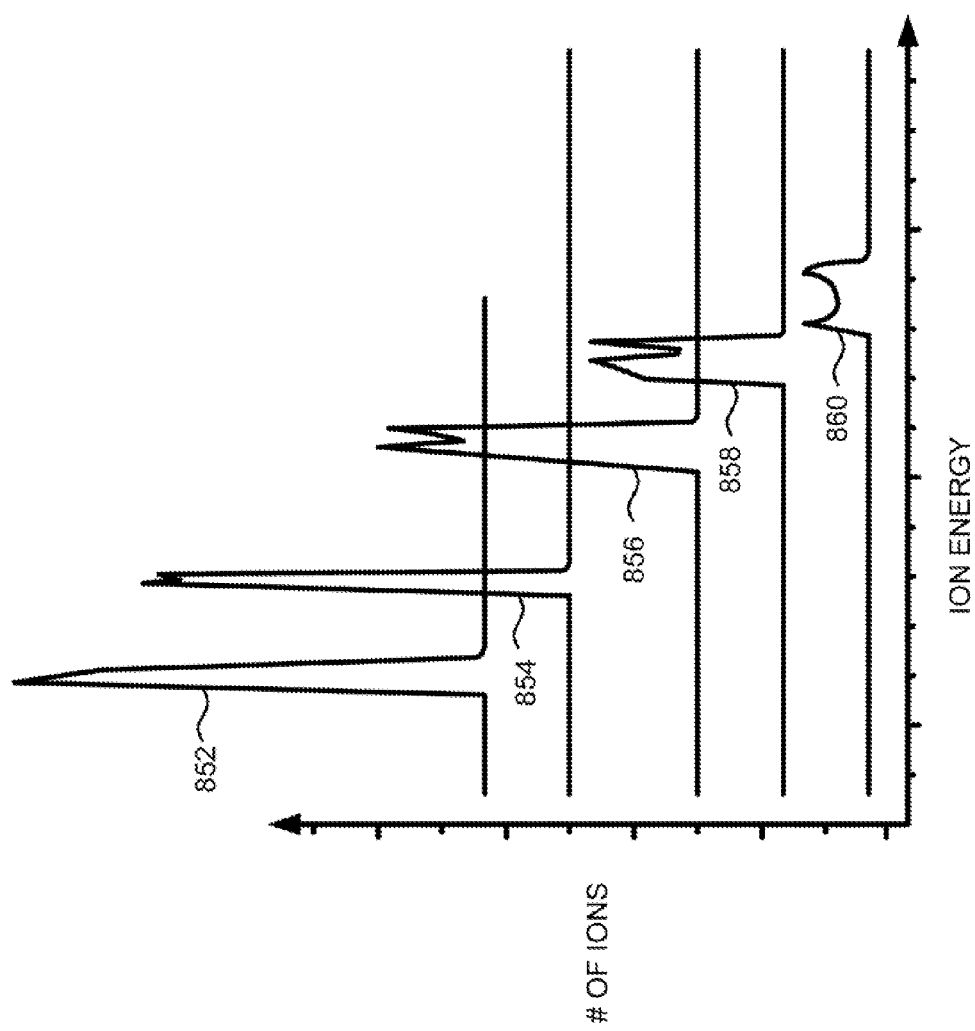
FIG. 8B shows the response of the 60 MHz RF signal at various bias RF powers.

FIG. 8B shows the response of the 60 MHz RF signal at 100 W bias RF power (852), 200 W bias RF power (854), 400 W bias RF power (856), 800 W bias RF power (858), and 1,100 W bias RF power (860) respectively. Note that the width of the ion energy distribution (WIDTH) tends to get slightly wider at higher bias RF power (but not to the same extent as the 2 MHz signal of FIG. 8A). More importantly, the mean value shifts to the right so the ion energy tends to be higher at 1,100 W of bias RF power (compared to, for example, 200 W of bias RF power.

Figure 8C:
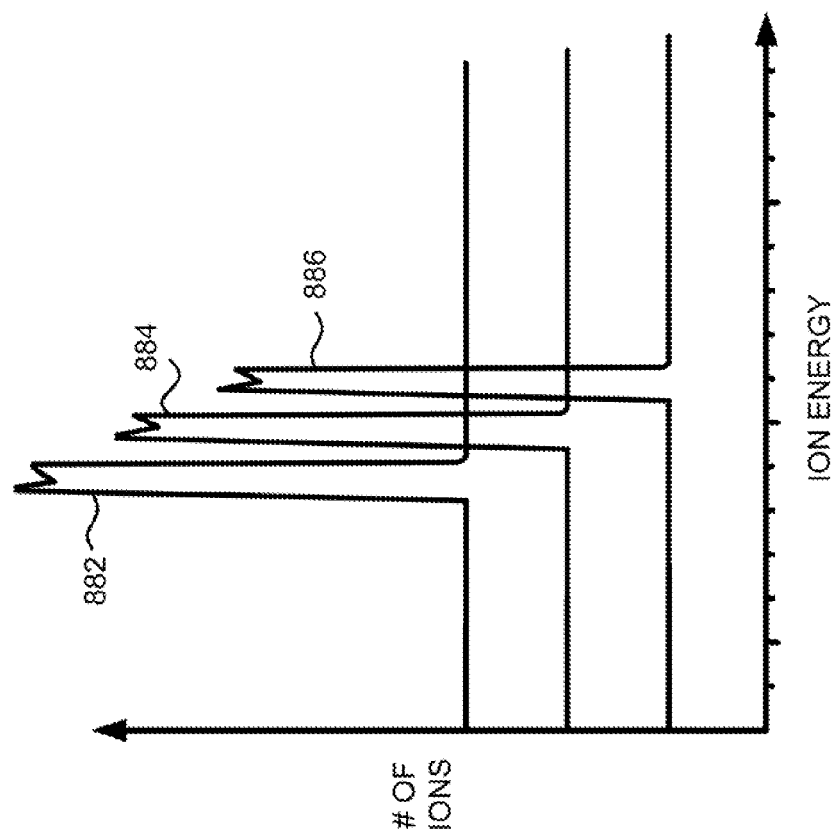
FIG. 8C shows the response of the 100 MHz RF signal at various bias RF powers.

FIG. 8C shows the response of the 100 MHz RF signal at 200 W bias RF power (882), 400 W bias RF power (884), and 800 W bias RF power (886) respectively. Note that the width of the ion energy distribution remains substantially the same, but the mean value has shifted slightly left and right depending on the bias RF power setting. A comparison between FIGS. 8C, 8B, and 8A reveal that at 100 MHz, the response has become saturated in that there is much less shifting of the mean ion energy value in response to a change in the bias RF power level.

Figure 9A:
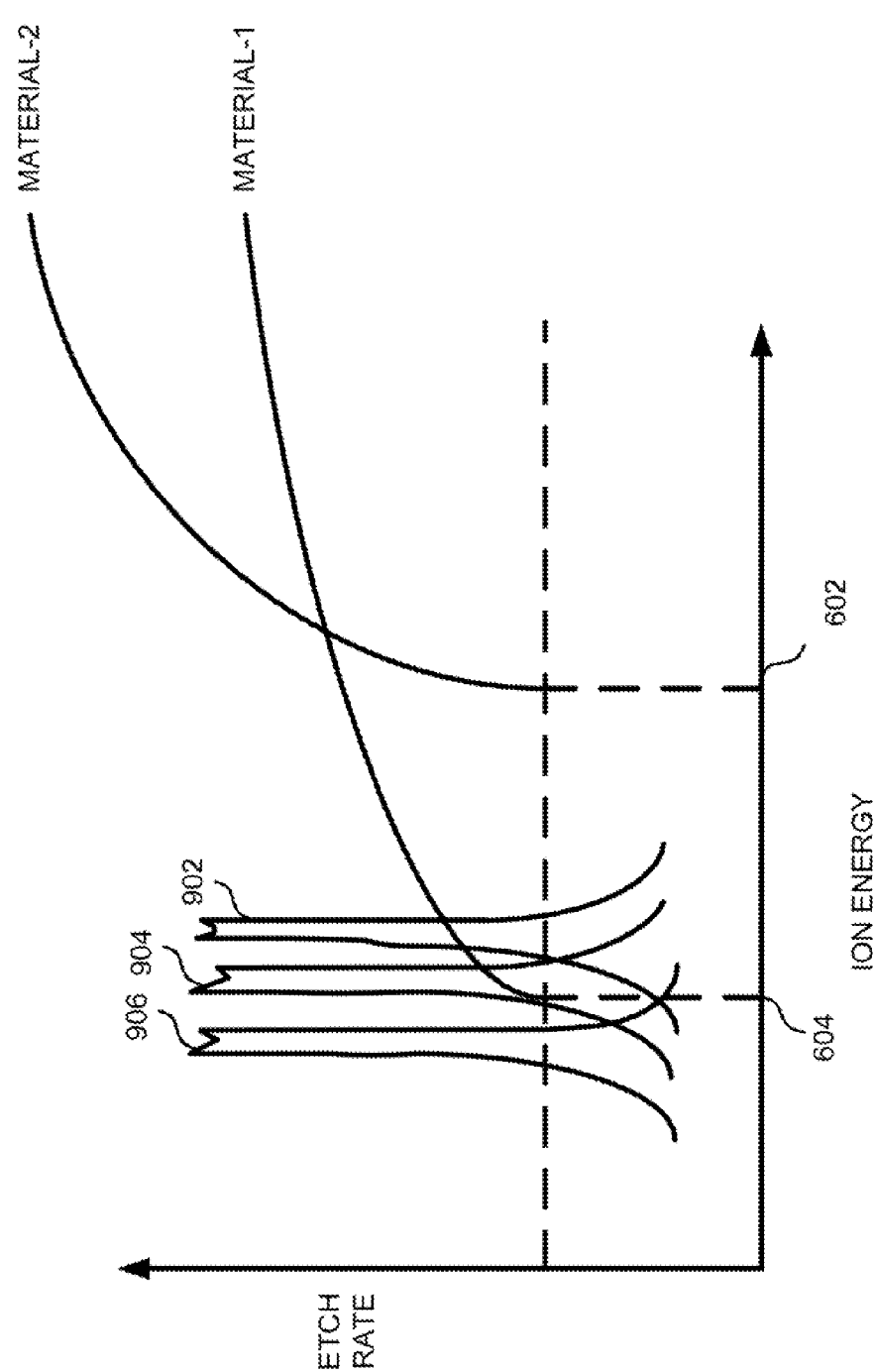
FIG. 9A illustrates a situation wherein the etch selectivity is high but the etch rate is slow.

Thus, for some etches, using the 100 MHz may not result in the highest etch rate possible although selectively may be high. This is illustrated FIG. 9A wherein the bias RF power is set at 200 W (902), 400 W (904), and 800 W (906) respectively, and the etch that results is a relatively slow etch through MATERIAL_1. In an extreme case, the ion energy distribution may stay to the left of point 604 irrespective of the bias RF power s setting. In this case, it may be said that no etching of MATERIAL_1 is possible.

Figure 9B:
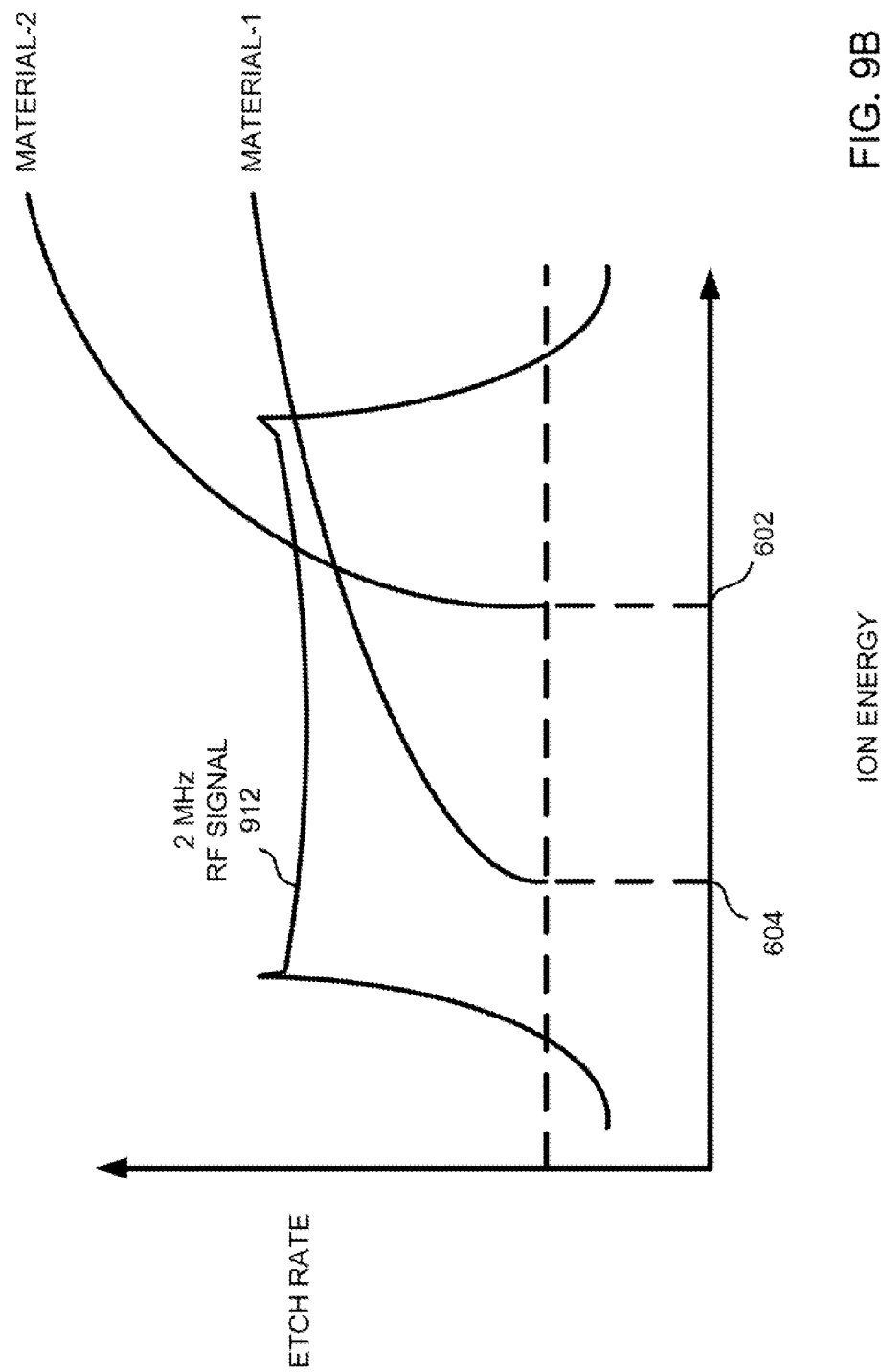
FIG. 9B shows the situation wherein the 2 MHz RF signal undesirably causes etching of MATERIAL_2 irrespective of the bias RF power setting.

FIG. 9B shows the other extreme, wherein the 2 MHz RF signal 912 causes etching of MATERIAL_2 irrespective of the bias RF power setting. This is because the ion energy distribution of the 2 MHz RF signal is relatively wide, and precise focusing of the ion energy in the region between points 602 and 604 could not be achieved. Although changing the bias RF power will cause the ion energy distribution for the 2 MHz RF signal to shift left or right, the point is the etch cannot be made satisfactorily selectively to MATERIAL_2.

FIG. 9C shows the situation wherein an appropriate RF frequency is selected. In this case, the ion energy is both focused and satisfactorily responsive to bias RF power setting, which allows for a wide process window. In FIG. 9C, the exemplar RF frequency is 60 MHz. By varying the bias RF power between 200 W (914), 300 W (912), and 400 W (910), it is possible to focus most of the ion energy in the region where the etch rate for MATERIAL_1 is highest but there is substantially no etching of MATERIAL_2. In the example of FIG. 9C, this is accomplished by choosing a RF frequency of 60 MHz and a bias RF power of 300 W.

Note that this aspect of the invention addresses etching of features using a tailored RF frequency and/or bias RF power setting to achieve a high selectivity. As is well known, etches may involve multiple frequencies. While etching through a barrier layer, for example, one RF signal having a particular RF frequency may be responsible for etching through the barrier layer while another RF signal having another RF frequency may improve the etch by causing polymer deposition to occur on the photoresist surface or on the sidewalls of the etched feature, thereby protecting these areas from being unduly attacked.

The invention, while addressing the first component (i.e., selecting the proper RF signal that is responsible for the etching action) does not exclude the use of such additional RF signals having different RF frequencies to improve the etch. Furthermore, although 60 MHz is chosen for illustration purposes, the appropriate frequency depends on chamber design, the specific material being etched and/or being protected, the etchants employed, and other factors. By way of example, it is expected that frequencies in the range of about 30 MHz to about 80 MHz, more preferably between about 45 MHz to about 75 MHz, and preferably at about 60 MHz may be advantageous for a highly selective low-K dielectric etch.

Figure 1C:
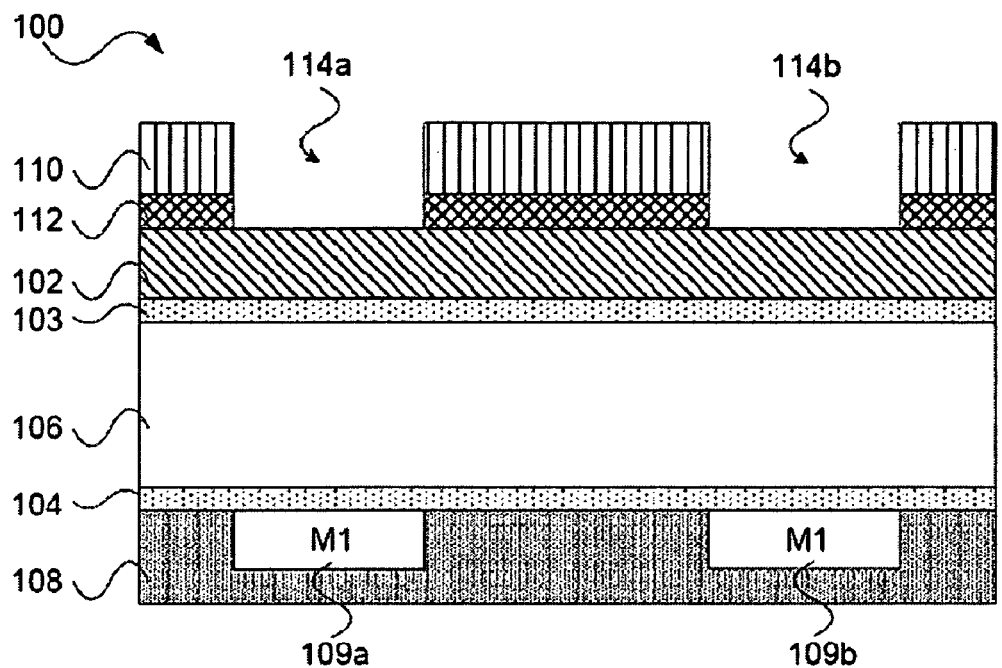
Figure 1D:
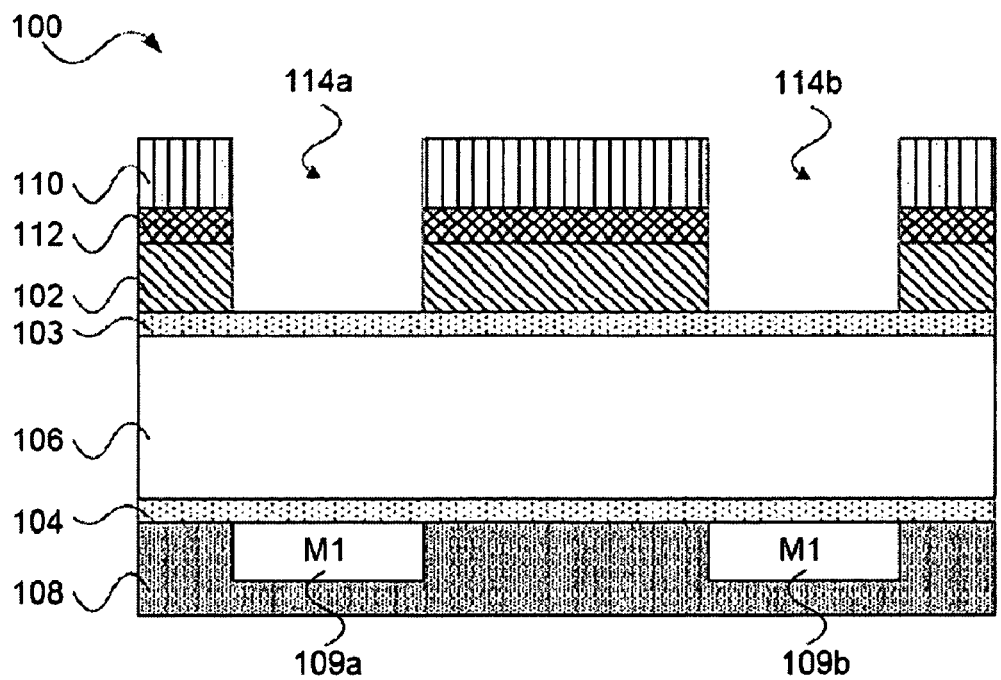
Figure 1E:
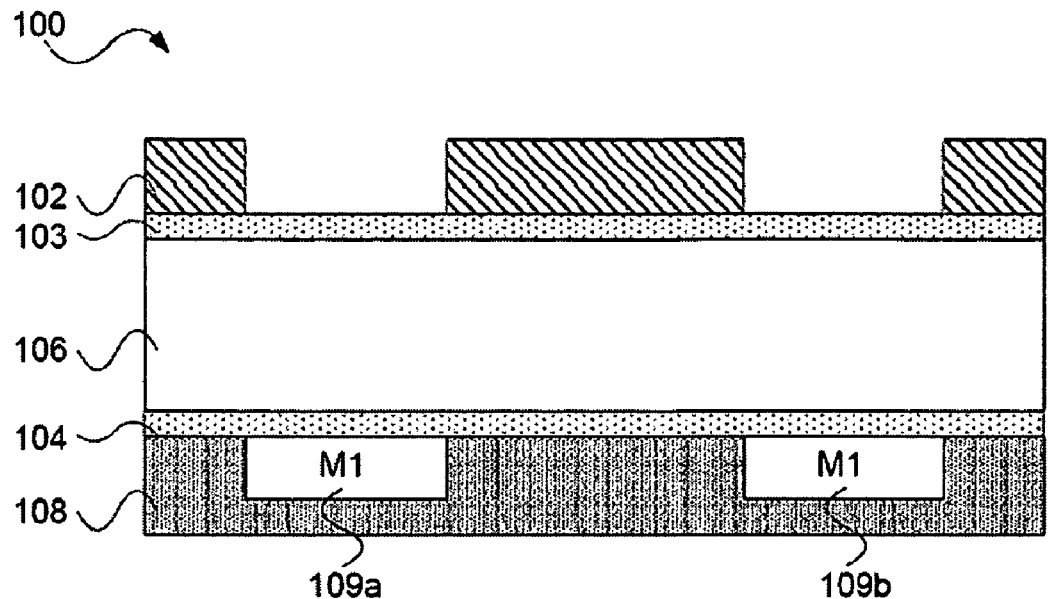
Figure 1F:
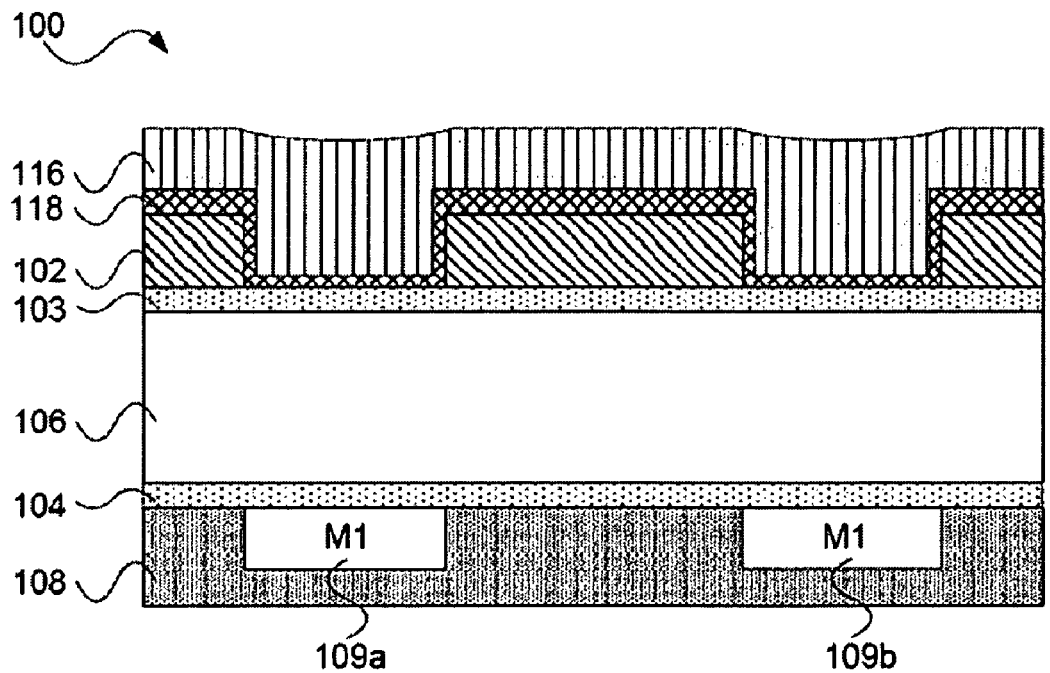
Figure 1G:
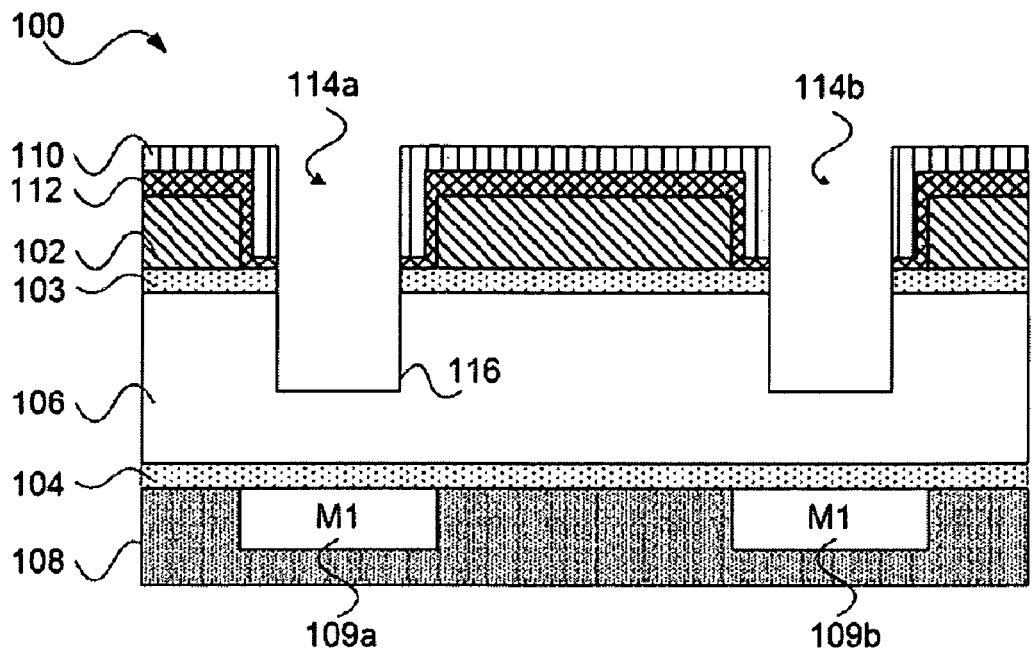
Figure 1H:
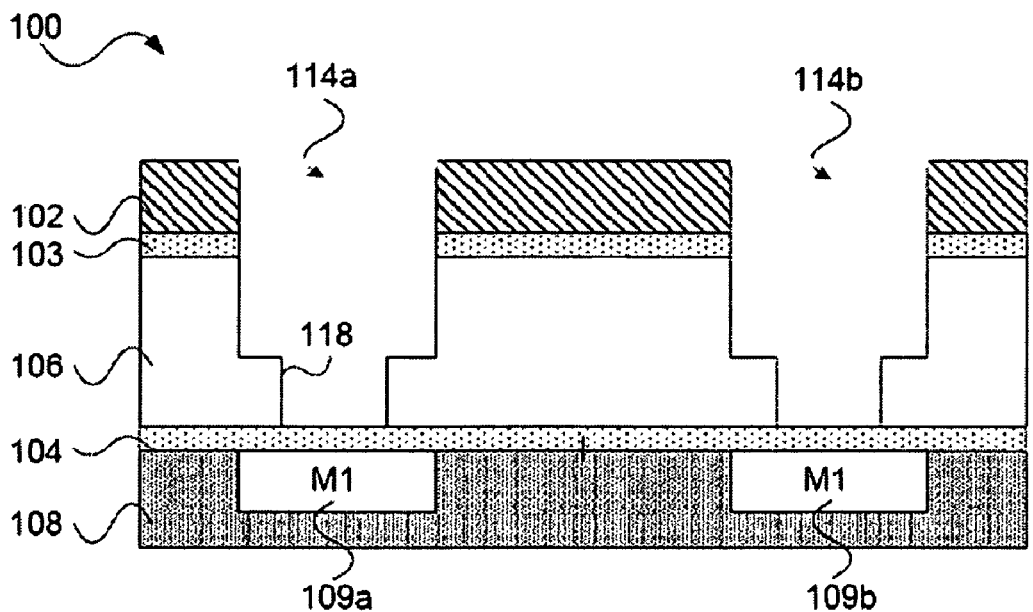
Figure 1I:
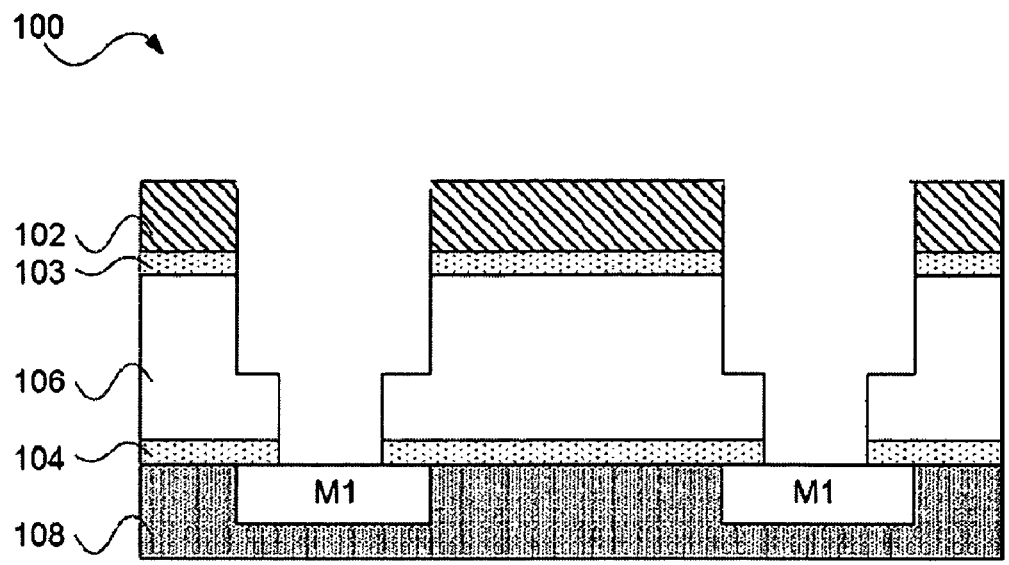
Figure 1J:
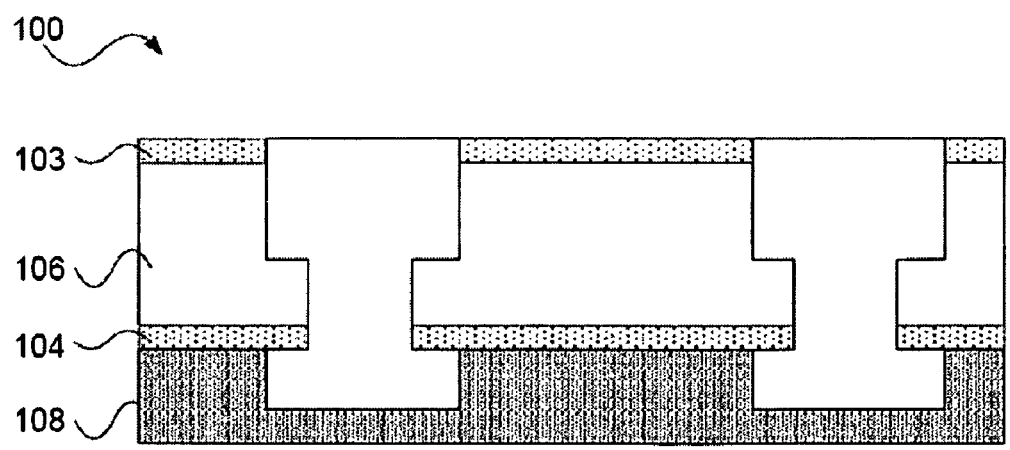
Figure 2A:
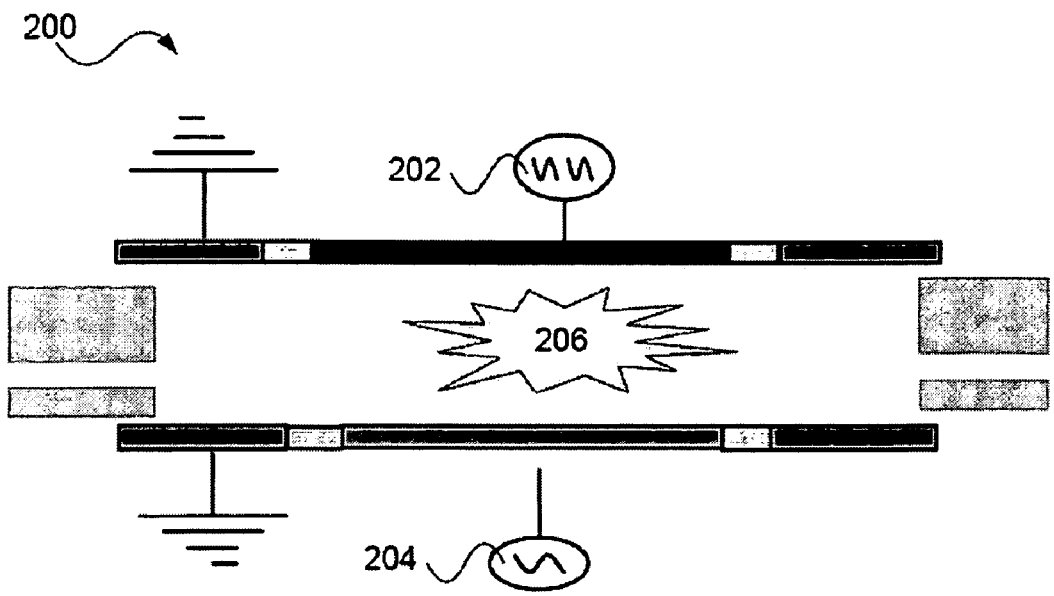
FIG. 2A illustrates a simplified diagram of a dual frequency triode plasma processing system.
Figure 2B:
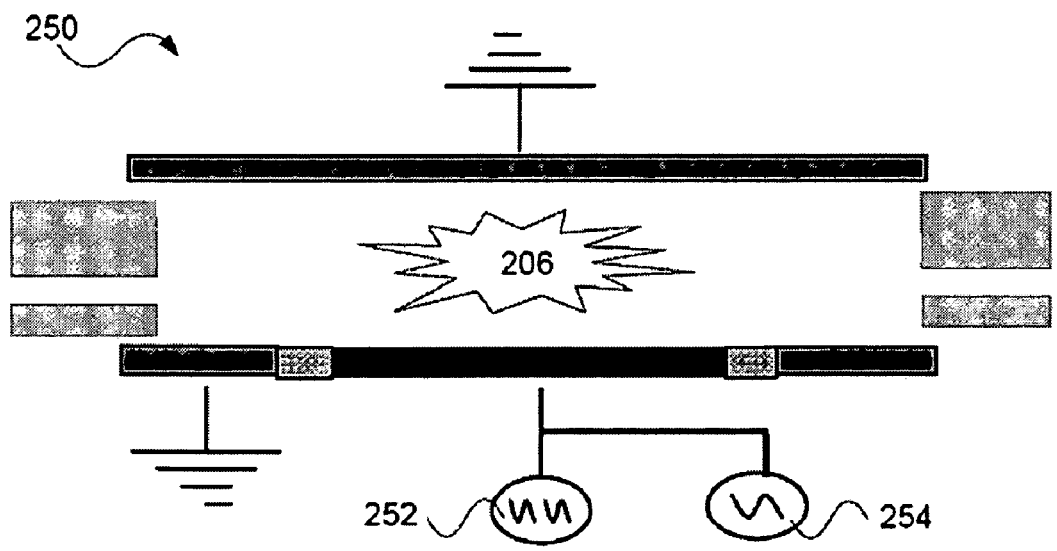
FIG. 2B illustrates a simplified diagram of a dual frequency diode plasma processing system.

In one embodiment, it is contemplated that the invention is highly useful in providing a barrier etch through a SiN and/or SiC layer. By selecting the appropriate RF frequency and/or RF bias power, a high selectivity to the dielectric layer can be achieved. With reference to FIG. 1H, the barrier layer is shown as layer 104, and the etch may be designed to etch through the barrier layer 104 to the underlying metal layer 109 without unduly attacking the dielectric shoulders (of dielectric layer 106) that are disposed in the trench. A barrier etch that is highly selective to the dielectric material ensures that the result will remain a via, not erroneously extending the already existing trench down to the metal layer 109. In another embodiment, the invention is highly useful in etching the dielectric layer in a manner that is selective to another layer on the substrate.

Figure 10:
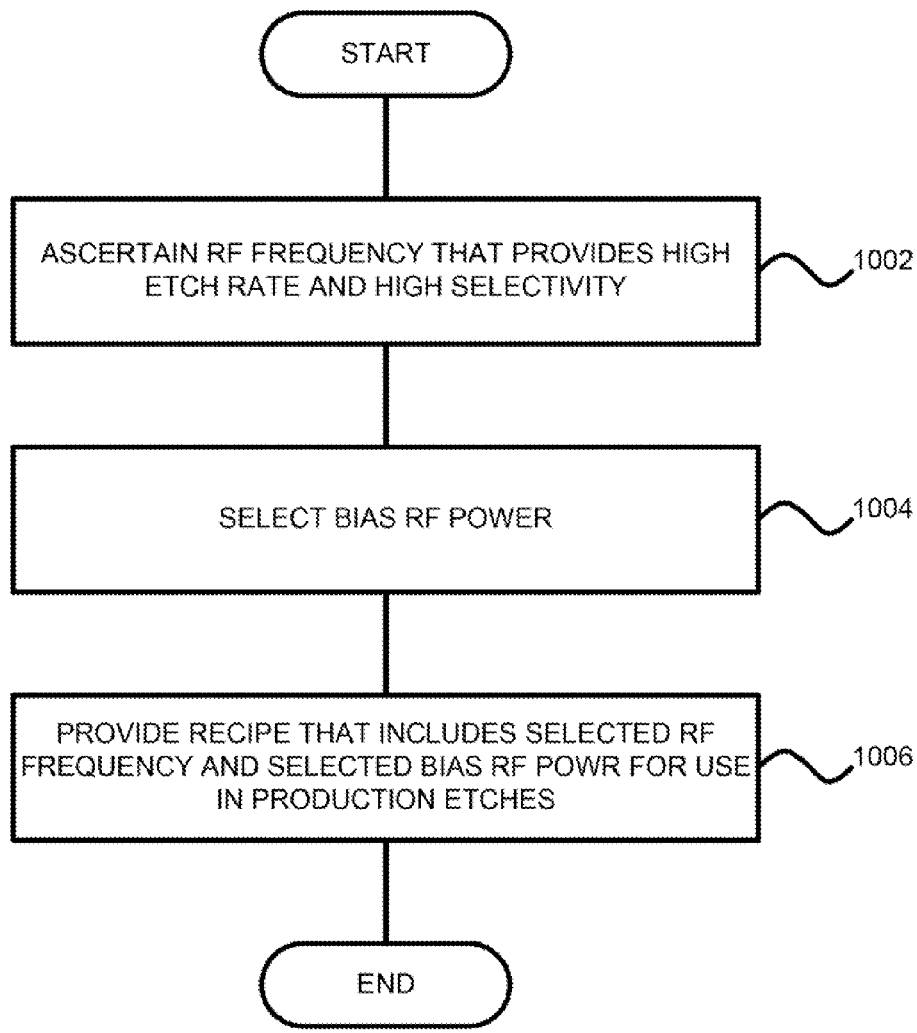
FIG. 10 shows, in accordance with an embodiment of the present invention, an etch technique that provides a high selectivity to a second material while etching through a first layer comprising a first material.

FIG. 10 shows, in accordance with an embodiment of the present invention, an etch technique that provides a high selectivity to a second material while etching through a first layer comprising a first material. In step 1002, the RF frequency is ascertained. This may involve, for example, performing multiple empirical test etches in a controlled environment (e.g., factory, environment) with various recipes to select an RF frequency as being most satisfactory. For example, an RF frequency that results in a high etch rate through the first material of the first layer and is both highly selectively to the second material and satisfactorily responsive to the bias RF power setting is selected. In step 1004, the bias RF power at the chosen RF frequency is selected. This bias RF power is preferably one that provides for the highest etch rate through the first material while causing little or substantially no etching of the second material of the second layer.

In one embodiment, steps 1002 and 1004 may be reversed. In other words, a range of RF power may be given to the process engineer and the process engineer may perform empirical test etches to determine the RF frequency that offers the best combination of high etch rate through the first material and high selectivity, to the second material. Generally speaking, the process engineer would select the combination of RF frequency and bias RF power that allows the etch selectivity to exceed a predefined selectivity threshold.

In step 1006, the recipe obtained, which includes the selected RF frequency and bias RF power but may also include other parameters such as gas flow rates, etchant composition, chamber pressure, helium cooling pressure, are furnished to the production environment. In the production environment (e.g., a facility that etches wafers for commercial, profit-orient purposes) may then employ the furnished recipe to produce etched products (such as etched wafers). The etched products are then subsequently made into integrated circuit chips to be incorporated into electronic devices, such as computers or consumer electronic devices.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan HP™, Exelan HPT™, Exelan 2300™, etc.), other plasma processing systems may be used. It should also be noted that there are many alternative ways of implementing the methods of the present invention.

Having disclosed exemplary embodiments and the best mode, modifications and variations may be made to the disclosed embodiments while remaining within the subject and spirit of the invention as defined by the following claims.

What is claimed is:

1. A method for selectively etching a substrate in a plasma processing system that includes an electrode, the substrate including a first layer formed of a first material having a first ion energy threshold for etching and a second layer formed of a second material having a second ion energy threshold for etching, said second ion energy threshold being greater than said first ion energy threshold, the method comprising:
   coupling said electrode to said substrate;
   providing a bias RF signal to said electrode to produce an ion energy distribution; and
   configuring a bias frequency of said bias RF signal such that
      a mean ion energy value of said ion energy distribution is between said first ion energy threshold and said second ion energy threshold and that
      a first difference between said first ion energy threshold and said mean ion energy value of said ion energy distribution is greater than a second difference between said second ion energy threshold and said mean ion energy value of said ion energy distribution,
   wherein said plasma processing system represents an inductively coupled plasma processing system.

2. The method of claim 1 further comprising increasing said bias frequency to reduce a width of said ion energy distribution.

3. The method of claim 1 further comprising adjusting a bias RF power of said bias RF signal to shift said mean ion energy value of said ion energy distribution.

4. The method of claim 1 further comprising increasing a bias RF power of said bias RF signal to increase an etch rate of said first layer while maintaining said mean ion energy value of said ion energy distribution between said first ion energy threshold and said second ion energy threshold.

5. The method of claim 1 wherein said bias frequency is between 45 MHz and 75 MHz.

6. The method of claim 1 wherein said bias frequency is between 30 MHz and 80 MHz.

7. The method of claim 1 wherein said bias frequency is less than 100 MHz.

8. The method of claim 1 wherein said bias frequency is greater than 2 MHz.

9. The method of claim 1 wherein said bias frequency is 60 MHz.

10. The method of claim 1 wherein a bias RF power of said bias RF signal is 300 W.

11. The method of claim 1 further comprising applying a second RF signal for polymer deposition, said second RF signal having a second frequency different from said bias frequency of said bias RF signal.

12. The method of claim 1 wherein said first material represents a barrier material, and said second material represents a dielectric material.

13. The method of claim 1 wherein said first material represents a dielectric material.

14. The method of claim 1 further comprising performing multiple empirical test etches in a controlled environment with various recipes to select said bias frequency.

15. The method of claim 14 wherein said various recipes at least include various bias RF power settings for said bias RF signal.

16. The method of claim 14 further comprising selecting at least a bias RF power for said bias RF signal through said empirical test etches.

17. The method of claim 14 further comprising selecting at least a gas flow rate, for etching said substrate, through said empirical test etches.

18. The method of claim 14 further comprising selecting at least an etchant composition, for etching said substrate, through said empirical test etches.

19. The method of claim 14 further comprising selecting at east a chamber pressure, for etching said substrate, through said empirical test etches.

20. The method of claim 14 further comprising selecting at least a helium cooling pressure, for etching said substrate, through said empirical test etches.

* * * * *